United States Patent
Yoo

(10) Patent No.: US 7,138,324 B2
(45) Date of Patent: Nov. 21, 2006

(54) METHOD OF INHIBITING DEGRADATION OF GATE OXIDE FILM

(75) Inventor: Kyung Dong Yoo, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/293,124

(22) Filed: Dec. 5, 2005

(65) Prior Publication Data

US 2006/0084231 A1   Apr. 20, 2006

Related U.S. Application Data

(63) Continuation-in-part of application No. 10/878,364, filed on Jun. 29, 2004.

(30) Foreign Application Priority Data

Dec. 23, 2003   (KR) .......................... 2003-0095301

(51) Int. Cl.
*H01L 21/3205* (2006.01)
*H01L 21/4763* (2006.01)

(52) U.S. Cl. ............................. 438/585; 257/E51.006; 257/E27.06

(58) Field of Classification Search ................ 438/288, 438/585; 257/E51.006, E27.06
See application file for complete search history.

(56) References Cited

U.S. PATENT DOCUMENTS

| 5,264,380 A | 11/1993 | Pfiester |
| 5,457,060 A | 10/1995 | Chang |
| 5,882,961 A | 3/1999 | Klingbeil et al. |
| 6,599,792 B1 | 7/2003 | Jung |
| 2005/0059228 A1 | 3/2005 | Bu et al. |

FOREIGN PATENT DOCUMENTS

| JP | 11289088 A | 10/1999 |
| JP | 20041530066 A | 5/2004 |
| KR | 1020030052272 A | 6/2003 |

*Primary Examiner*—Michelle Estrada
(74) *Attorney, Agent, or Firm*—Heller Ehrman LLP

(57) ABSTRACT

A method of inhibiting degradation of a transistor gate oxide film by high density plasma is disclosed. After a gate electrode is formed, impurity is implanted on the surface of an oxide film, thereby changing surface characteristics of the oxide film to scatter ultraviolet rays which are factors of degradation of the gate insulating film. Accordingly, the ultraviolet rays are prevented from being permeated into a gate insulating oxide film.

5 Claims, 4 Drawing Sheets

METHOD OF INHIBITING DEGRADATION OF GATE OXIDE FILM

BACKGROUND OF THE INVENTION

1. Field of the Invention

The present invention generally relates to a method of inhibiting degradation of a transistor gate oxide film due to ultraviolet rays in a High Density Plasma (hereinafter, referred to as "HDP") process, and more specifically, to a method for effectively preventing ultraviolet rays from permeating into a gate insulating oxide film by implanting impurity into the surface of an oxide film so as to change a surface characteristic of the oxide film.

2. Description of the Prior Art

A HDP process utilizes high power plasma, which generates ultraviolet rays (UV). The UV is known to have a predetermined wavelength ranging from about 200 to 800 nm. According to the Plank's Law on wavelength of light and its energy, the energy E is proportional to frequency (E=hv; h=Plank's constant, v=frequency of light). Since the frequency v is inversely proportional to the wavelength of light, E becomes larger as the wavelength of light becomes shorter. Accordingly, the UV having a wavelength ranging from 200 to 800 nm has an energy ranging from about 5 eV to 1.5 eV. If such energy reaches a silicon substrate, an Electron-Hole Pair is formed. The formation of the Electron-Hole Pair is generally occurs when an energy larger than the Band-Gap energy of 1.1 eV in the silicon is injected thereto. The electron is again trapped in a gate oxide film, thereby degrading characteristics of the oxide film.

A Plasma Induced Damage (hereinafter, referred to as "PID") or a Plasma Induced Radiation Damage (hereinafter, referred to as "PIRD") of the HDP cannot be controlled in the conventional process. A method of inhibiting the use of HDP or reducing power of plasma to reduce the PID has been proposed. However, the method reduces the uniform deposition ability which is an advantage in using HDP, resulting in short circuits in a subsequent process.

Recently, a method of deposition an amorphous silicon film after a formation of a transistor has been proposed to inhibit degradation of a gate oxide film by PID or PIRD. In accordance with the method, a formation process of contact for connecting wires cannot be performed by a single etching process. In addition, a possibility of a short circuit between wires by the amorphous silicon film exists.

SUMMARY OF THE INVENTION

It is an object of the present invention to provide a method of inhibiting degradation of a transistor gate oxide film by HDP.

In an embodiment, a method for manufacturing a semiconductor device comprises the steps of:

forming a gate oxide film and a gate electrode on a semiconductor substrate;

forming an oxide film on the semiconductor substrate including the gate electrode;

implanting an impurity into the surface of the oxide film to form a doped oxide film; and forming a high density plasma (HDP) oxide film as an interlayer insulating film on the doped oxide film by a HDP process, wherein the doped oxide film prevents UV (ultra-violet) rays generated by the HDP process from penetrating the oxide film.

The impurity is selected from the group consisting of As, P, B, $BF_2$, BF, Si, Ge and combinations thereof. A concentration of the impurity ranges from $1e^{17}/cm^3$ to $1e^{22}/cm^3$. The impurity is implanted at a depth of less than 1000 Å from the surface of the oxide film.

The step of implanting an impurity is performed immediately after the formation of the oxide film, thereby obtaining the effect of the present invention.

According to the method of the present invention, the surface characteristics of the oxide film are changed so that UV rays generated from the HDP process is not permeated into the gate oxide film deposited on the semiconductor substrate.

DETAILED DESCRIPTION OF THE PREFERRED EMBODIMENTS

The present invention will be described in detail with reference to the accompanying drawings.

FIGS. 1a through 1d are cross-sectional views illustrating a method for manufacturing a semiconductor device according to an embodiment of the present invention.

Figure 1A:
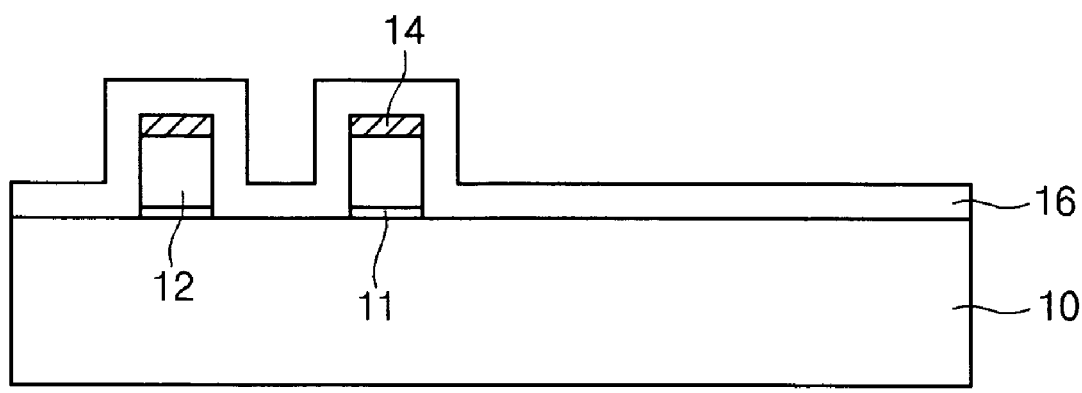
FIGS. 1a through 1d are cross-sectional views illustrating a method for manufacturing a semiconductor device according to an embodiment of the present invention.

Referring to FIG. 1a, a plurality of gate electrodes 12 having a stacked structure of silicides such as polysilicon and tungsten silicide are formed on a substrate 10 having various elements thereon. A gate oxide film 11 is formed at an interface of the substrate 10 and the gate electrode 12, and a hard mask insulating film 14 is formed on the gate electrode 12 for preventing a damage of the gate electrode 12 in a subsequent self-alignment etching process.

Thereafter, spacers (not shown) such as a nitride film are formed on sidewalls of the gate electrode 12, and then an oxide film 16 is deposited on the resulting structure.

Figure 1B:
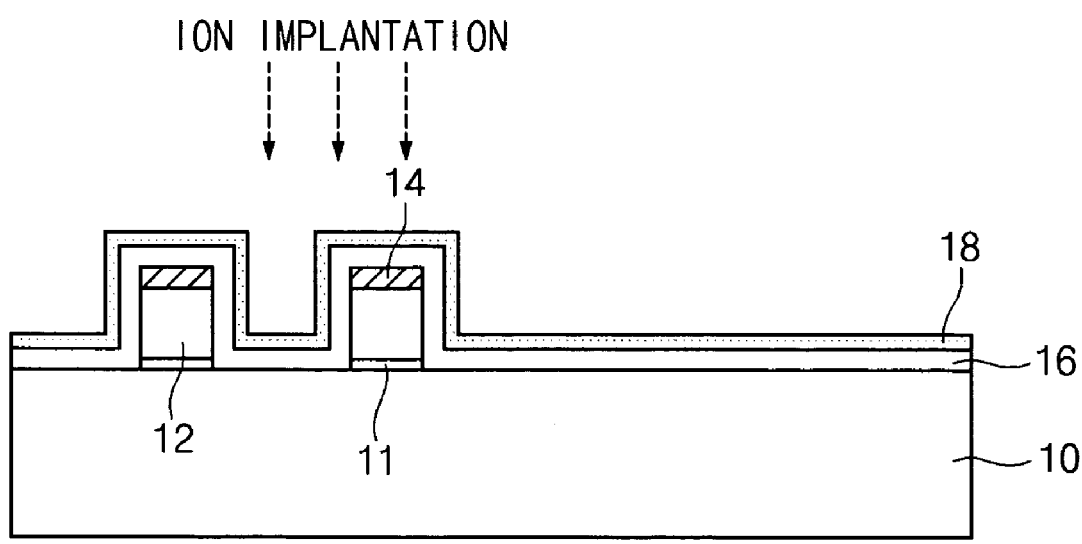

Referring to FIG. 1b, an impurity is implanted into a surface of the oxide film 16 to change the chemical state of the surface of the oxide film 16, thereby a doped oxide film 18 is formed.

Figure 1C:
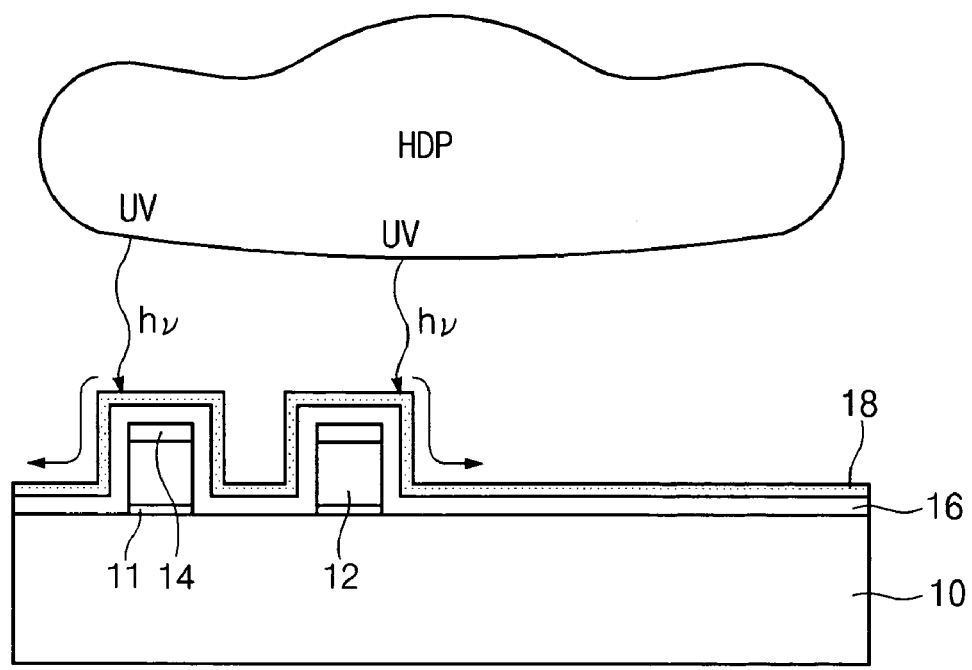
Figure 1D:
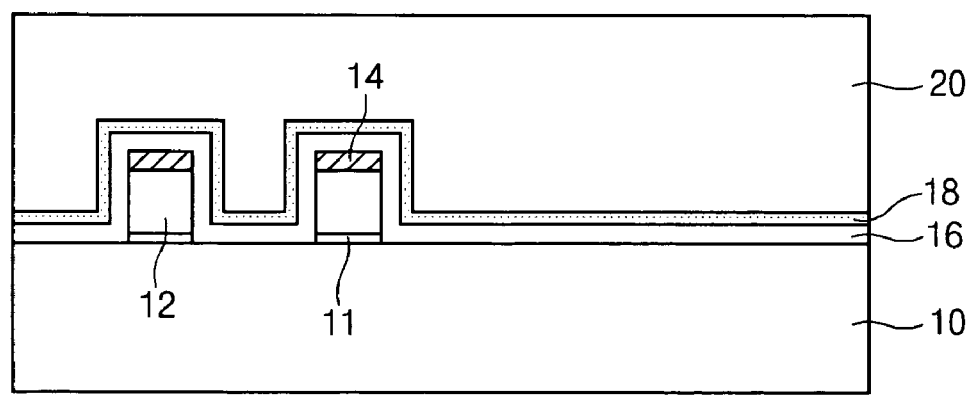

Referring to FIGS. 1c and 1d, a planarized interlayer insulating oxide film 20 is formed on the top surface of the doped oxide film 18 by a HDP process. Here, the impurity in the doped oxide film 18 scatters UV rays generated from the HDP process to inhibit the UV from permeating into the oxide film 16.

Figure 2:
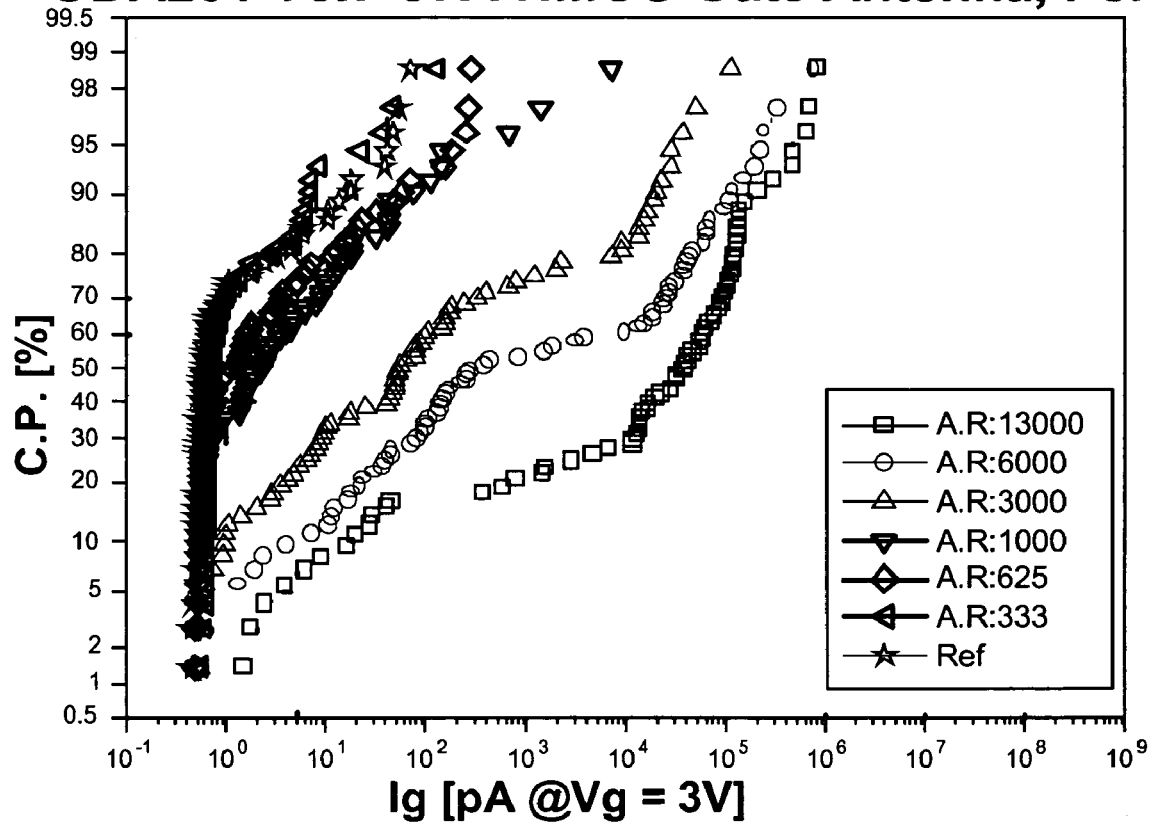
FIG. 2 is a graph illustrating a measurement result of an antenna test pattern of a gate oxide film according to a conventional process.
Figure 3:
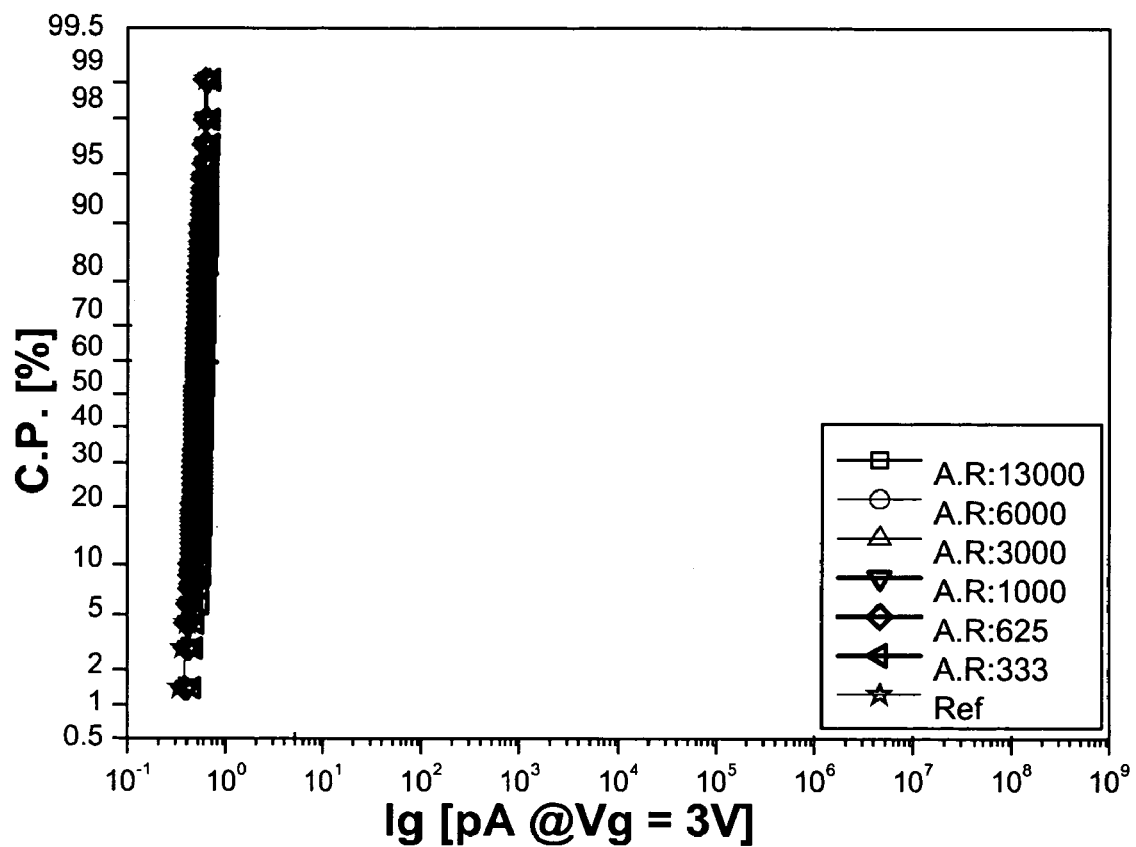
FIG. 3 is a graph illustrating a measurement result of an antenna test pattern of a gate oxide film according to an embodiment of the present invention.

In order to compare the effect of the present invention with that of the conventional method, FIGS. 2 and 3 show graphs illustrating measurement results of antenna test patterns. An antenna Ratio ("A.R") which refers to a ratio of an area of the gate oxide film to that of gate that receives PID, and test patterns ("Ref") having no separate antenna gate from 13000 times are shown in FIGS. 2 and 3.

The measurement was done by applying a voltage of 3V to the gate to measure a leakage current flowing into the silicon substrate. The thickness of the gate oxide film is 37 Å, which is a thickness sensitive to PID. After the formation of the gate electrode, the oxide film 16 is deposited by using a low pressure chemical vapor deposition method which does not generate a PID. The leakage current is measured after the deposition of a HDP interlayer insulating oxide film 20 on the oxide film 16 and various wiring process for test patterns.

As seen in the measurement results, the amount of leakage current flowing through the oxide film increases proportional to the antenna ratio. In 50% cumulative distribution, the leakage current of less than 1.0 pA is generated under the Ref condition and an A.R condition of 333 times, and the leakage current of 10 nA is generated under an A.R condition of 13000 times (see FIG. 2).

Contrary to the conventional method, leakage current of less than 1.0 pA is generated in all cumulative distribution regardless of A.R in accordance with the present invention (see FIG. 3). This is because injected impurity forms a doped oxide film for inhibiting UV from permeating into the surface of the insulating oxide film.

As discussed earlier, the degradation phenomenon of the gate oxide film by PID is prevented even in high antenna ratio in accordance with the present invention. Accordingly, yield may be improved in an integrated circuit fabrication process, and degradation of reliability such as HCD (Hot Carrier Degradation) by degradation of the gate oxide film can be prevented.

What is claimed is:

1. A method for manufacturing a semiconductor device, comprising the steps of:

forming a gate oxide film and a gate electrode on a semiconductor substrate;

forming an oxide film on the semiconductor substrate including the gate electrode;

implanting an impurity into the surface of the oxide film to form a doped oxide film; and forming a high density plasma (HDP) oxide film as an interlayer insulating film on the doped oxide film by a HDP process, wherein the doped oxide film prevents UV (ultra-violet) rays generated by the HDP process from penetrating the gate oxide film.

2. The method according to claim 1, wherein the impurity is selected from the group consisting of As, P, B, $BF_2$ BF, Si, Ge and combinations thereof.

3. The method according to one of claims 1, wherein a concentration of the impurity ranges from $1e^{17}/cm^3$ to $1e^{22}/cm^3$.

4. The method according to claim 1, wherein the step of implanting the impurity is performed immediately after the formation of the oxide film.

5. The method according to claim 1, wherein the impurity is implanted at a depth of less than 1000 Å from the surface of the oxide film.

* * * * *